(12) United States Patent
Liu et al.

(10) Patent No.: US 11,340,980 B2
(45) Date of Patent: May 24, 2022

(54) MANAGING OPEN BLOCKS IN MEMORY SYSTEMS

(71) Applicant: Macronix International Co., Ltd., Hsinchu (TW)

(72) Inventors: Yi-Chun Liu, Hsinchu (TW); Wei Jie Chen, Hsinchu (TW); Ching Ting Lu, New Taipei (TW); Zheng Wu, Taoyuan (TW)

(73) Assignee: Macronix International Co., Ltd., Hsinchu (TW)

( * ) Notice: Subject to any disclaimer, the term of this patent is extended or adjusted under 35 U.S.C. 154(b) by 106 days.

(21) Appl. No.: 16/906,712

(22) Filed: Jun. 19, 2020

(65) Prior Publication Data

US 2021/0397510 A1 Dec. 23, 2021

(51) Int. Cl.
*G11C 29/00* (2006.01)
*G06F 11/10* (2006.01)
*G06F 11/07* (2006.01)
*G06F 11/30* (2006.01)
*G11C 16/08* (2006.01)
*G06F 12/0882* (2016.01)
*G11C 16/34* (2006.01)
*G11C 16/14* (2006.01)
*G06F 12/02* (2006.01)

(52) U.S. Cl.
CPC ........ *G06F 11/1044* (2013.01); *G06F 11/076* (2013.01); *G06F 11/1068* (2013.01); *G06F 11/3037* (2013.01); *G06F 12/0246* (2013.01); *G06F 12/0882* (2013.01); *G11C 16/08* (2013.01); *G11C 16/14* (2013.01); *G11C 16/3431* (2013.01)

(58) Field of Classification Search
CPC ............. G06F 11/1044; G06F 11/1068; G06F 11/076; G06F 11/3034; G06F 12/0882; G06F 12/024; G11C 16/08; G11C 16/3431; G11C 16/41
See application file for complete search history.

(56) References Cited

U.S. PATENT DOCUMENTS

2016/0141047 A1* 5/2016 Sehgal ................ G11C 11/5642
365/185.02

* cited by examiner

*Primary Examiner* — Samir W Rizk
(74) *Attorney, Agent, or Firm* — Fish & Richardson P.C.

(57) ABSTRACT

Systems, methods, and apparatus including computer-readable mediums for managing open blocks in memory systems such as NAND flash memory devices are provided. In one aspect, a memory system includes a memory and a memory controller. The memory includes multiple blocks each having a plurality of word lines. The memory controller is coupled to the memory and configured to: evaluate a read disturbance level of an open block, the open block having one or more programmed word lines and one or more blank word lines, and in response to determining that the read disturbance level of the open block is beyond a threshold level, manage each memory cell in at least one of the blank word lines to have a smaller data storing capacity than each memory cell in at least one of the one or more programmed word lines so as to reduce impact of read disturbance.

20 Claims, 11 Drawing Sheets

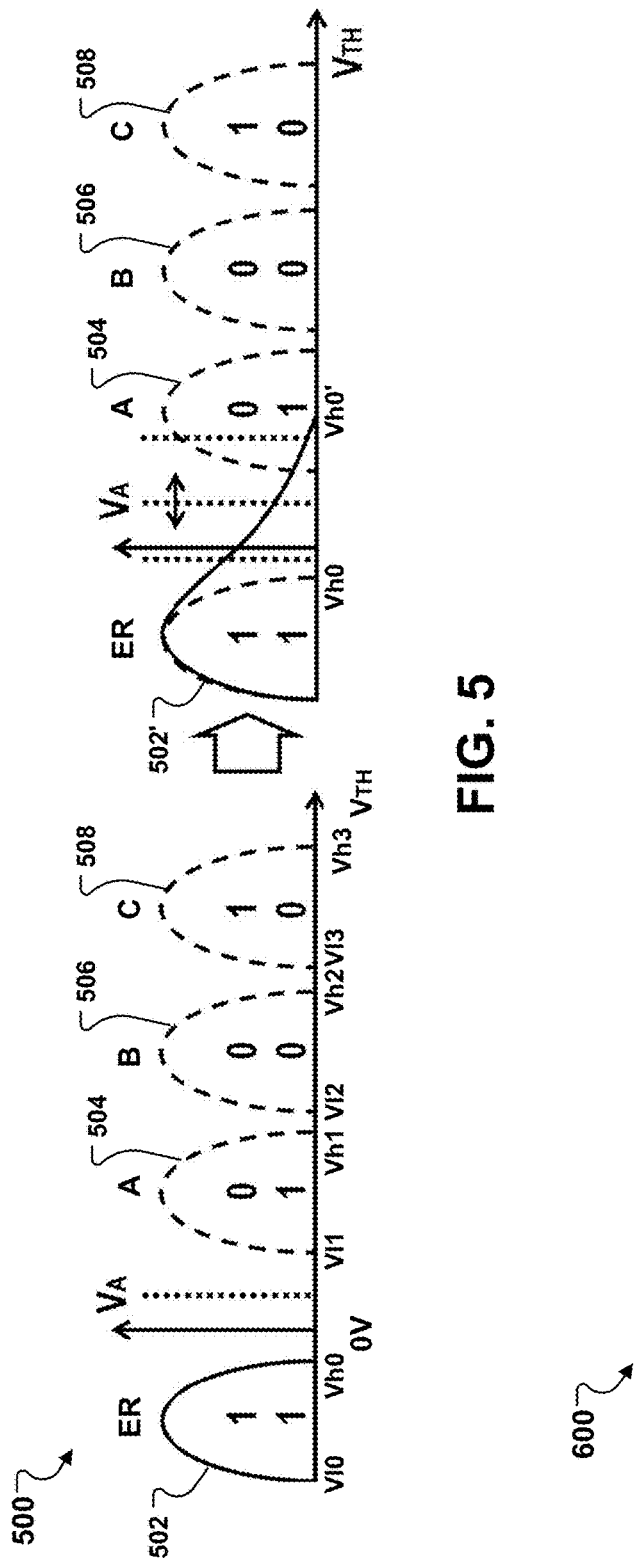
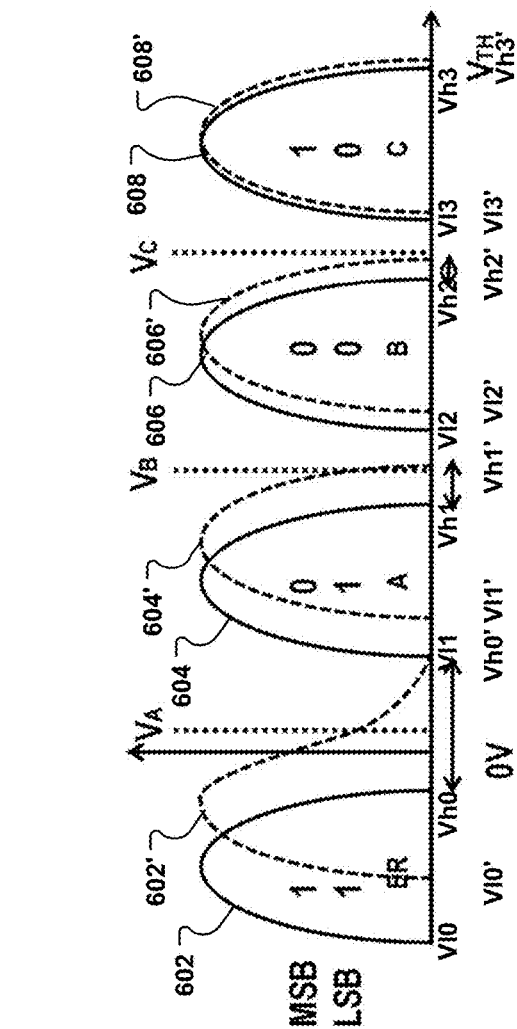
FIG. 5
FIG. 6

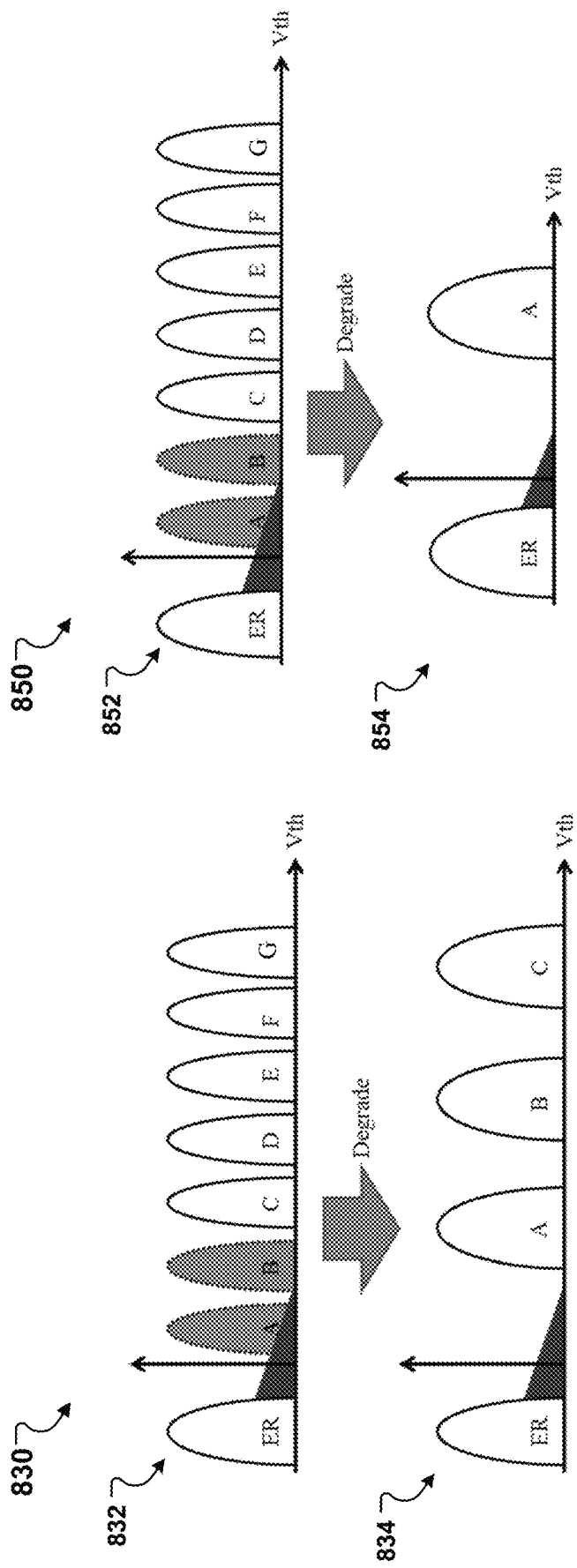

MANAGING OPEN BLOCKS IN MEMORY SYSTEMS

BACKGROUND

Some memory systems, e.g., NAND flash memories, experience data corruption which may impact data integrity. To prevent the data corruption, memory controllers can correct deficient memory cells or erase memory blocks suffering from severe data integrity such as read disturbance.

SUMMARY

The present disclosure describes systems and techniques for managing open blocks in memory systems, e.g., non-volatile memory systems such as NAND flash memory.

One aspect of the present disclosure features a memory system including: a memory including multiple blocks each having a plurality of pages associated with a plurality of word lines and a memory controller coupled to the memory. The memory controller is configured to: evaluate a read disturbance level of an open block, the open block including one or more programmed pages associated with one or more programmed word lines and one or more blank pages associated with one or more blank word lines; and in response to determining that the read disturbance level of the open block is beyond a threshold level, manage memory cells in at least one of the one or more blank word lines such that each memory cell in the at least one of the one or more blank word lines has a smaller data storing capacity than each memory cell in at least one of the one or more programmed word lines.

The memory controller can be configured to manage the memory cells in at least one of the one or more blank word lines such that data is represented by non-overlapping states of the memory cells in the at least one of one or more blank word lines.

In some embodiments, each memory cell in the at least one of the one or more programmed word lines has a first storing level for storing a first number of bits, and the memory controller can be configured to degrade each memory cell in the at least one of the one or more blank word lines to have a second storing level for storing a second number of bits, the second number being smaller than the first number. A difference between the first number and the second number can be identical to one of 1, 2, 3, and 4.

In some embodiments, the first number of bits represents a first number of states, and the second number of bits represents a second number of states, the second number of states being smaller than the first number of states, and the memory controller can be configured to degrade the memory cells in the at least one of the one or more blank word lines by configuring threshold voltage ranges of the memory cells in the at least one of the one or more blank word lines to represent the second number of states. The first number of states can be $2^N$ where N=2, 3 or 4 and the second number of states can be $2^{N-1}$.

In some embodiments, a first memory cell having the first storing level in a first erased state has a threshold voltage between a first higher limit voltage and a first lower limit voltage, and a second memory cell having the second storing level in a second erased state has a second threshold voltage between a second higher limit voltage and a second lower limit voltage, the second higher limit voltage being larger than the first higher limit voltage.

In some embodiments, the one or more programmed word lines include a first word line and a second word line, and memory cells in the second word line have a smaller storing level than memory cells in the first word line.

In some embodiments, each memory cell in the at least one of the one or more programmed word lines is capable of representing a first number of states, and the memory controller is configured to degrade each memory cell in the at least one of the one or more blank word lines to be capable of representing a second number of states, the second number being smaller than the first number. The memory controller can be configured to degrade the memory cells in the at least one of the one or more blank word lines by reconfiguring threshold voltage ranges of the second number of states representable by the memory cells in the at least one of the one or more blank word lines.

In some embodiments, the memory controller is configured to: degrade each memory cell in at least two adjacent blank word lines of the one or more blank word lines to be capable of representing the second number of states and combine at least two memory cells in the at least two adjacent word lines to represent a third number of states, each of the at least two memory cells being in a respective one of the at least two adjacent word lines, the third number of states being a combination of the second number of states of each of the at least two memory cells.

In some embodiments, each memory cell in the at least one of the one or more programmed word lines is capable of representing a series of states, and the memory controller is configured to: store data into memory cells in the at least one of the one or more blank word lines by representing the data by the memory cells in at least two selected states among the series of states, each of the at least two selected states having a threshold voltage higher than other unselected states among the series of states. For the memory cells in the at least one of the one or more blank word lines, the at least two selected states can be undisturbed states, and the other unselected states can be disturbed states.

In some embodiments, the memory cells in the at least one of the one or more blank word lines are programmable into a lower page and at least one higher page. The memory controller can be configured to program bits in the lower page to be a fixed pattern and program bits in the at least one higher page to represent the data. The lower page can include a least-significant-bit (LSB) page, and the at least one higher page can include a most-significant-bit (MSB) page.

In some embodiments, each memory cell in the at least one of the one or more programmed word lines is capable of representing a plurality of states including an erased state and a series of programmed states, each of the plurality of states having a respective threshold voltage range, and the memory controller is configured to determine that a memory cell in the open block has overlapping states at least by determining that the erased state of the memory cell has a higher limit voltage in a corresponding threshold voltage range of at least one of the series of programmed states. The memory controller can be configured to determine that the read disturbance level of the open block is beyond the threshold level by determining that a number of memory cells having overlapping states in one of the one or more blank word lines exceeds a threshold number.

In some embodiments, the memory controller is configured to determine that the read disturbance level of the open block is beyond the threshold level by determining that a number of error bits in one of the one or more programmed pages exceeds a threshold number. The memory controller can be configured to determine whether a bit in the one of the one or more programmed pages is an error bit by determining whether a state of a memory cell representing the bit has a threshold voltage higher than an original higher limit voltage of the state or whether the memory cell has overlapping states. The threshold number can be predetermined based on a number of correction bits in error correction codes (ECCs) for the one of the one or more programmed pages.

In some embodiments, the one of the one or more programmed pages is associated with a specific word line in the open block, memory cells in the specific word line being more sensitive to be disturbed than memory cells in other word lines in the open block.

In some cases, each bit in the one of the one or more programmed pages can be programmed to be a fixed value. In some cases, the one of the one or more programmed pages includes a series of sequential bits, and the memory controller can be configured to program at least one bit in at least one of a starting region or an ending region of the series of sequential bits to be a fixed value. In some cases, the one of the one or more programmed pages includes multiple chunks each having a series of sequential bits, and the memory controller can be configured to program at least one bit in at least one of a starting region or an ending region of the series of sequential bits in each of the chunks to be a fixed value. In some cases, the one of the one or more programmed pages includes a series of sequential bits, and the memory controller can be configured to program alternating bits in the series with data and a fixed value.

In some embodiments, the memory controller is configured to evaluate the read disturbance level based on at least one of characteristics of the open block, the characteristics of the open block including an erase count and a read count.

In some embodiments, the memory controller is configured to store user data or redundancy in memory cells in the at least one of the one or more blank word lines.

In some embodiments, the memory controller is configured to: evaluate a read disturbance level of a second open block, the second open block including one or more programmed pages and one or more blank pages, and in response to determining that the read disturbance level of the second open block is below the threshold level, store data in at least one of the one or more blank pages with a same data storing capacity as at least one of the one or more programmed pages.

In some embodiments, the memory controller is configured to: evaluate a read disturbance level of a second open block, the second open block including one or more second programmed pages and one or more second blank pages, and in response to determining that the read disturbance level of the second open block is beyond a second threshold level, migrate data stored in the one or more second programmed pages of the second open block then erase the second open block after the migration, the second threshold level being higher than the threshold level. The memory controller can be configured to manage the memory cells in the one or more blank word lines in the open block in response to determining that the read disturbance level of the open block is beyond the threshold level and below the second threshold level.

Another aspect of the present disclosure features a memory controller including at least one processor and at least one non-transitory machine-readable storage medium coupled to the at least one processor having machine-executable instructions stored thereon that, when executed by the at least one processor, cause the at least one processor to perform operations of the memory controller of the above aspect.

A further aspect of the present disclosure features a memory system including: a memory including multiple blocks each having a plurality of pages associated with a plurality of word lines; and a memory controller coupled to the memory and configured to manage memory cells in one or more blank word lines in an open block such that each memory cell in at least one of the one or more blank word lines has a smaller data storing capacity than each memory cell in at least one of one or more programmed word lines in the open block, then store data in the memory cells in the at least one of the one or more blank word line.

Implementations of the above techniques include methods, systems, computer program products and computer-readable media. In one example, a method can be performed by a memory controller coupled to a non-volatile memory and the method can include the above-described actions performed by the memory controller, e.g., the actions for managing open blocks in the non-volatile memory. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

Implementations of the present disclosure provide systems and methods for managing open blocks in a memory device, such as an NAND flash memory, which can enable the use of open blocks that are impaired by read disturbance. In particular, blank pages in the open blocks that are impaired by read disturbance can be used to increase storage capability while maintaining data integrity and/or reducing write amplification (e.g., reducing to write more information due to read disturbance).

The techniques can be implemented for any type of memories suffering from read disturbance, data retention, and/or other disturbance effects. Besides blocks, the techniques can be implemented for sub-blocks within a block, which can better manage the block. The techniques can also be implemented for super blocks (or striped-blocks) that each combine multiple blocks from different planes, where the multiple blocks suffer from same read disturbance effect due to same read/erase/write operations.

The techniques can be applied to various types of volatile memory devices or non-volatile memory devices, such as NAND flash memory, NOR flash memory, resistive random-access memory (RRAM), phase-change random-access memory (PCRAM), among others. The techniques can be applied to two-dimensional (2D) memory devices or three-dimensional (3D) memory devices. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, among others.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 5 illustrates an example of quantifying a read disturbance level of an open block of a memory, according to one or more implementations.

FIG. 6 illustrates another example of quantifying a read disturbance level of an open block of a memory, according to one or more implementations.

FIGS. 7B-1 to 7B-4 illustrate examples of programming specific patterns in memory cells in weak word lines in a block, according to one or more implementations.

FIG. 8B illustrates another example of degrading a storing level of memory cell from TLC to MLC to avoid overlapping states, according to one or more implementations.

FIG. 8C illustrates a further example of degrading a storing level of memory cell from TLC to SLC to avoid overlapping states, according to one or more implementations.

DETAILED DESCRIPTION

Figure 1A:
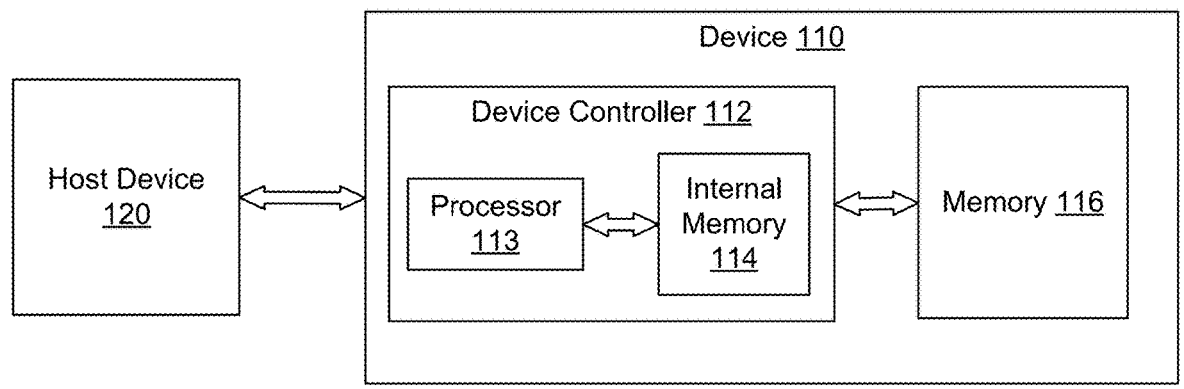
FIG. 1A illustrates an example of a system, according to one or more implementations.

An open block in a memory device includes at least one programmed page associated with at least one programmed word line and at least one blank page associated with at least one blank word line. Due to frequent read operations, the open block may suffer from read disturbance, in which states of memory cells, e.g., an erased state and one or more programmed states, in the open block may have increased threshold voltages. The read disturbance may cause more errors in the data in a programmed page due to the larger threshold voltage ranges for the states of the memory cells, and may cause a blank page to be unavailable for programming because a disturbed state is more likely to cause errors. In some cases, the open block with read disturbance may be not used any more, but may be erased, e.g., after the previously stored data is migrated.

Implementations of the present disclosure provide systems and methods for managing open blocks in a memory device, such as an NAND flash memory, which can enable the use of open blocks that are impaired by read disturbance. In particular, blank pages in the open blocks that are impaired by read disturbance can be used to increase storage capability while maintaining data integrity and/or reducing write amplification (e.g., reducing to write more information due to read disturbance).

In some implementations, a memory controller in the memory device can first evaluate (or quantify) a read disturbance effect (or a read disturbance level) on an open block. In some cases, the read disturbance effect is determined to be severe or the read disturbance level is determined to be beyond a first threshold level, e.g., if the number of error bits in a programmed page is beyond a first error bit threshold, if an erased state of memory cells in a programmed word line (or memory cells in a blank word line) overlaps with a majority or all of the other programmed states, or if the number of memory cells having overlapping states in at least one of the blank word lines is beyond a first overlapping state threshold. In response to determining that the read disturbance effect is severe, e.g., that the read disturbance level is beyond the first threshold level, the memory controller can determine that the open block can be no longer used and can then degrade usage of the memory cells in the blank pages.

In some cases, the memory controller determines that the read disturbance effect of an open block is light or determines that the read disturbance level is below a second threshold level, e.g., if the number of error bits in a programmed page is below a second error bit threshold, if an erased state of memory cells in a programmed word line (or memory cells in a blank word line) does not overlap with the other programmed states, or if the number of memory cells having overlapping states in each of the blank word lines is below a second overlapping state threshold. In response to determining that the read disturbance effect is light, e.g., that the read disturbance level is below the second threshold level, the memory controller can store data in memory cells in at least one of the blank word lines in the same manner as data is stored in the programmed word lines. That is, a memory cell in a blank word line has a data storing capacity the same as a memory cell in a programmed word line.

In some cases, the read disturbance effect is determined to be moderate or the read disturbance level is determined to be beyond the second threshold level but less than the first threshold level, e.g., if the number of error bits in a programmed page is beyond a second predetermined threshold but lower than the first predetermined threshold, or if an erased state of memory cells in a programmed word line (or memory cells in a blank word line) only overlaps with one or a few of the programmed states (e.g., for MLC, the erased state only overlaps with one of the three programmed state, for TLC, the erased state only overlaps with no more than five of the seven programmed states), or if the number of memory cells having overlapping states in at least one of the blank word lines is higher than the second overlapping state threshold but lower than the first overlapping state threshold. In response to determining that the read disturbance effect is moderate, e.g., that the read disturbance level is between the first threshold level and the second threshold level, as discussed with further details below, the memory controller can degrade usage of the memory cells in the blank word lines such that there is no overlapping state in memory cells in the blank word lines. As a result, a memory cell in a blank word line may have a smaller data storing capacity than a memory cell in a programmed word line. In such a way, even if memory cells in the blank word lines in the open block are suffering from read disturbance, the memory cells can be still used, e.g., for storing user data, for storing redundancy like RAID (Redundant Array of Inexpensive Disks or Redundant Array of Independent Disks), and/or for higher ECC protection.

In some cases, the memory controller can degrade a storing level of the memory cells in the blank word lines, e.g., from MLC to SLC or from TLC to MLC or SLC, such that the new erased state does not overlap with the new programmed state(s). In some cases, the memory controller can degrade a storing level of the memory cells in the blank word lines to represent fewer states, e.g., from 4 states to 3 states, and then combine memory cells in adjacent blank word lines to represent a new number of states for storing data. In some cases, for the memory cells, an erased state overlaps one or more programmed states, and the memory controller can use non-overlapped or undisturbed programmed states for representing data.

In some implementations, the memory controller can estimate a read disturbance effect or a read disturbance level based on erase count, read count, and/or other suitable information of a block. In some implementations, the memory controller uses a hierarchical decision tree to determine whether a block can be used to store and whether and how to change, e.g., degrade, the data storage configuration. In some implementations, the decision tree has both the erase count and read count as inputs. Branches in the decision tree can be performed based on comparison of the erase count, read count, and/or other suitable information to threshold values, or based on more complex calculations having the erase count, read count, and/or other suitable information as inputs to other functions.

For example, the memory controller can degrade usage of memory cells in an open block originally with TLC memory cells. When the erase count for the open block is less than 1,000, the memory controller can degrade the storing level of original TLC memory cells to MLC, i.e., from 3 bits to 2 bits per cell, after 10,000 read operations, and degrade the storing level of TLC memory cells to SLC, i.e., from 3 bits to 1 bit per cell, after 20,000 read operations. When the erase count for the open block is less than 2,000 but larger than 1,000, the memory controller can degrade the storing level of TLC memory cells to MLC, i.e., from 3 bits to 2 bits per cell, after 5,000 read operations, and degrade the storing level of TLC memory cells to SLC, i.e., from 3 bits to 1 bit per cell, after 10,000 read operations. When the erase count for the open block is less than 3,000 or larger than 2,000, the memory controller can degrade the storing level of TLC memory cells to MLC, i.e., from 3 bits to 2 bits per cell, after 2,000 read operations, and degrade the storing level of TLC memory cells to SLC, i.e., from 3 bits to 1 bit per cell, after 5,000 read operations.

FIG. 1A illustrates an example of a system 100 that includes a device 110 and a host device 120. The device 110 includes a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk. For illustration purposes only, the following description uses a NAND flash memory as an example of the memory 116.

As discussed in further details below, the device controller 112 is configured to evaluate (or quantify) read disturbance effects (or read disturbance levels) of blocks, e.g., open blocks, in the memory 116 and manage the blocks for data storage accordingly, e.g., by degrading usage of memory cells in blank word lines in the open blocks to avoid read disturbance. The device controller 112 can evaluate the read disturbance effect in the memory 116 in a series of scenarios, e.g., in response to an external request or command (such as a host request or command from the host device 120), or automatically based on predetermined conditions, or periodically, or during background operation.

Figure 1B:
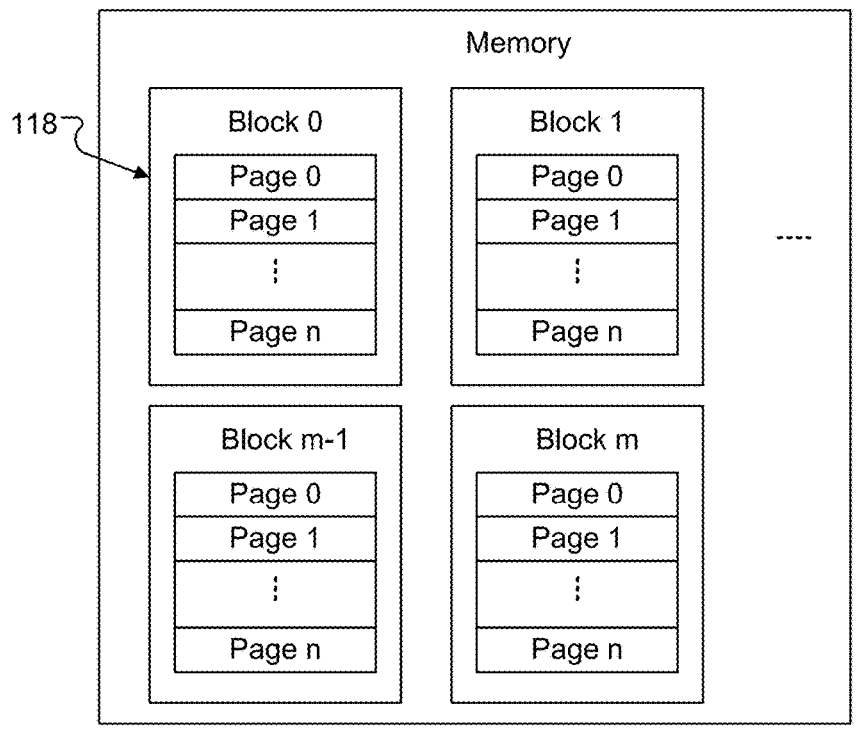
FIG. 1B illustrates an example memory, according to one or more implementations.

FIG. 1B illustrates an example configuration of the memory 116 that includes a plurality of physical blocks 118, e.g., Block 0, Block 1, . . . , Block m−1, and Block m. Each block can include a same number of pages, e.g., Page 0, Page 1, . . . , Page n. Each page has a unique number in the block.

Data is stored in the pages of the block according to the order of the unique numbers of the pages in the block. Each page can be read or written separately, and pages in a block can be erased together.

In some implementations, a block can be divided into a number of sub-blocks. Each sub-block can include one or more pages. Each page in a sub-block can be read or written separately. The one or more pages in each sub-block can be erased together.

In some implementations, the memory 116 includes one or more dies. Each die can be a memory chip and include a number of memory arrays and peripheral circuitry thereon. A memory array can include a number of planes, with each plane including a number of physical blocks of memory cells. Each physical block can include a number of pages of memory cells that can store a number of sectors of data. A super block can be specified, e.g., by a memory controller such as the controller 112 of FIG. 1A, to combine at least one physical block from different planes. Each physical block in the super block comes from a different plane, that is, any plane cannot provide more than one block in the super block. The super block includes a number of super pages each combining multiple pages from the corresponding multiple physical blocks in the super block. Each page in a super page can have a same page number in its corresponding physical block. A super page can be programmed with all the pages in the super page being programmed simultaneously.

Figure 1C:
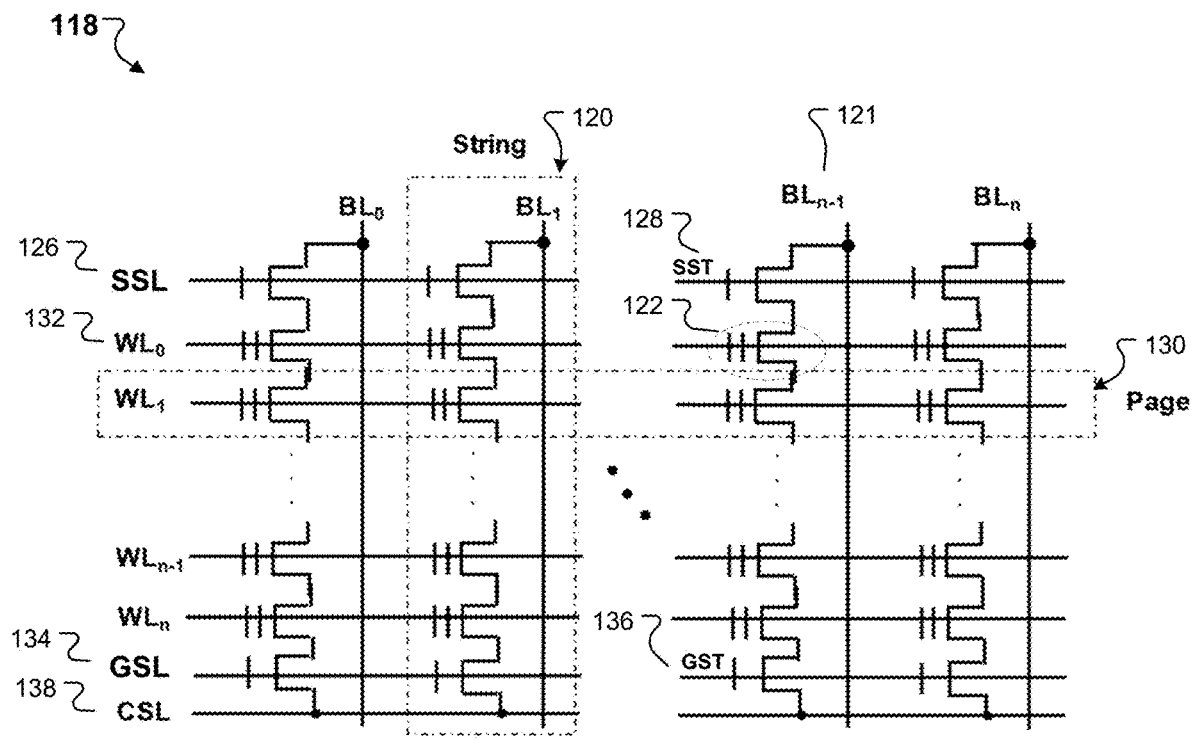
FIG. 1C illustrates an example block in a memory, according to one or more implementations.

FIG. 1C illustrates an example configuration of a block 118, e.g., a two-dimensional (2D) memory block, of the memory 116. The memory block 118 includes memory cells 122 that are coupled in series to column bit lines $BL_0$, $BL_1$, ..., $BL_{n-1}$, and $BL_n$ to form a number of cell strings 120, and to row word lines $WL_0$, $WL_1$, ..., $WL_{n-1}$, and $WL_n$ to form a number of cell pages 130.

Each memory cell is coupled to a row decoder via a respective word line 132 and coupled to a column decoder via a respective bit line 121. Accordingly, each memory cell can be selected for operation through the respective word line 132 and the respective bit line 121. A control logic is connected to the row decoder and the column decoder, e.g., via global word lines and global bit lines, and configured to control the memory cells 122 through the row decoder and the column decoder. The control logic can be configured to receive commands and/or data signal from the device controller 112.

A cell string 120 can include a number of memory cells 122, a source select transistor (SST) 128, and a ground select transistor (GST) 136, which are all connected in series. A gate of the SST 128 is connected to a source select line (SSL) 126. Gates of the SSTs in different strings are also connected to the same SSL. Gates of the memory cells 122 are respectively connected to word lines $WL_0$, $WL_1$, ..., $WL_{n-1}$, $WL_n$. The memory cells 122 are connected to a common source line (CSL) 138 via the GST 136. A gate of the GST 136 is connected to a ground select line (GSL) 134. Gates of the GSTs in different strings are also connected to the same GSL. The GST 136 and the SST 128 can be metal-oxide-semiconductor (MOS) transistors, and the memory cells 122 can be floating gate transistors.

A cell page 130 can include a number of memory cells 122. Gates of the memory cells 122 in the cell page 130 are coupled in series to a respective word line (WL). When an input voltage is applied to the word line, the input voltage is also applied to all the gates of the memory cells 122 in the cell page 130.

A memory cell can represent a number of states including an erased state and one or more programmed states. For example, in some cases, the memory cell is a single-level cell (SLC) that can store 1 bit and represent 2 states including an erased state (ER) and a programmed state (A). Memory cells in one word line can form one page. In some cases, the memory cell is a multi-level cell (MLC) such as a 2-level cell that can store 2 bits and represent 4 states including an erased state (ER) and three programmed states (A, B, and C). Memory cells in one word line can form two pages. In some cases, the memory cell is a triple-level cell (TLC) that can store 3 bits and represent 8 states including an erased state (ER) and seven programmed states (A, B, C, D, E, F, and G). Memory cells in one word line can form three pages. The states can have progressively higher voltage ranges, and the erased state can use the lowest voltage rage.

Figure 2:
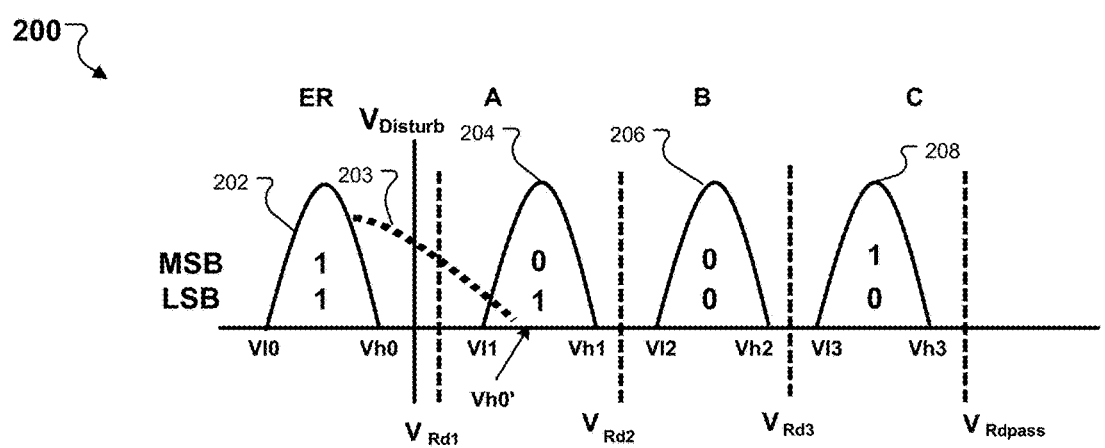
FIG. 2 illustrates an example of threshold voltage distributions of memory cells for different states, according to one or more implementations.

FIG. 2 illustrates an example 200 of threshold voltage distributions and read voltages for different states of a memory cell of a memory, according to one or more implementations. The memory cell can be the memory cell 122 of FIG. 1C. The memory can be a NAND flash memory. For illustration purposes only, the memory cell is an MLC capable of storing two-bit data. The memory cell can be programmed or erased to have any one of four states ER, A, B, and C. In some examples, ER is an erased state (1,1), and A, B, C are programmed states (0, 1), (0, 0), and (1, 0). The states ER, A, B and C have progressively higher read voltages. The MLC NAND flash memory can partition the two bits of each memory cell in a word line across two pages, which are the unit of data programmed at a time. The least significant bits (LSBs) of all memory cells in one word line form the LSB page of the word line, and the most significant bits (MSBs) of these cells on the word line form the MSB page of the word line.

Once programmed or erased, the memory cell has a corresponding threshold voltage. The threshold voltage is a characteristic of the memory cell. The memory cell can be a floating gate transistor. When a read voltage higher than or identical to the threshold voltage is applied to a gate of the memory cell, the memory cell can be turned on. When a read voltage lower than the threshold voltage is applied to a gate of the memory cell, the memory cell can be turned off. The read action is not a programmed or erased action and not intended to change a state of the memory cell.

Each state corresponds to a distribution of threshold voltages in a range between a lower limit voltage and a higher limit voltage. A memory cell having a threshold voltage within the range is considered to be in the corresponding state. In other words, a memory cell being in a state has a threshold voltage within the range. For example, if the memory cell has a threshold voltage between Vl0 and Vh0, the memory cell is in the state ER; if the memory cell has a threshold voltage between Vl1 and Vh1, the memory cell is in the state A; if the memory cell has a threshold voltage between Vl2 and Vh2, the memory cell is in the state B; and if the memory cell has a threshold voltage between Vl3 and Vh3, the memory cell is in the state C. Curves 202, 204, 206, 208 show threshold voltage distributions of the respective states ER, A, B, C of the memory cell, respectively.

During a read operation, a read voltage can be applied to a word line coupled to a gate of a selected memory cell to determine whether the selected memory cell is a turned-on or turned-off state. When a read voltage $V_{Rd1}$ that is larger than the threshold voltage of ER but smaller than the threshold voltage of A is applied, the memory cell is turned on when it has the state ER and turned off when it has the state A, B, or C; when a read voltage $V_{Rd2}$ that is larger than the threshold voltage of A but smaller than the threshold voltage of B is applied, the memory cell is turned on when it has the state ER or A and turned off when it has the state B or C; when a read voltage $V_{Rd3}$ that is larger than the threshold voltage of B but smaller than the threshold voltage of C is applied, the memory cell is turned on if it has the state ER, A, or B and off when it has the state C. When the read voltage $V_{Rdpass}$ that is larger than all the threshold voltages of the states ER, A, B, C is applied, the memory cell is turned on regardless of whatever state the memory cell had.

During the read operations, other memory cells in the same bit line as the selected memory cell are applied with a pass voltage $V_{Rdpass}$ and are turned on. Thus, if the selected memory cell is turned on under a read voltage $V_{Rd}$, the memory cells in the corresponding bit line form a conductive path, and there will be a current or a voltage change, which can be detected by a current or voltage sensor coupled to the bit line. If the selected memory cell is turned off under the read voltage, the memory cells in the corresponding bit line does not form a conductive path, and there is no current or no voltage change, which can be detected by a current or voltage sensor coupled to the bit line.

Due to repeated read operations, a read disturbance phenomenon may occur. In the read disturb phenomenon, a threshold voltage of the memory cell abnormally increases. As illustrated in FIG. 2, in some cases, the distribution curve 202 for the erased state ER includes a dotted curve 203, which includes a higher threshold voltage. For example, the new higher limit voltage Vh0' is larger than the higher limit voltage Vh0. When the new higher limit voltage Vh0' is in the threshold voltage range Vl1 and Vh1 of the programmed state A, the erased state ER overlaps with the programmed state A. That is, the memory cell has overlapping states. When a read voltage $V_{Disturb}$ is applied, the memory cell having a threshold voltage in the erased state ER becomes a turned-off state instead of a turned-on state. Thus, by detecting whether the memory cell is on or off under a specific read condition, it can be determined that whether or not the memory cell suffers from read disturbance. In some cases, memory cells being in states having lower threshold voltages, e.g., ER and A, are more susceptible to read disturbance than states having higher threshold voltages, e.g., B and C.

Figure 3:
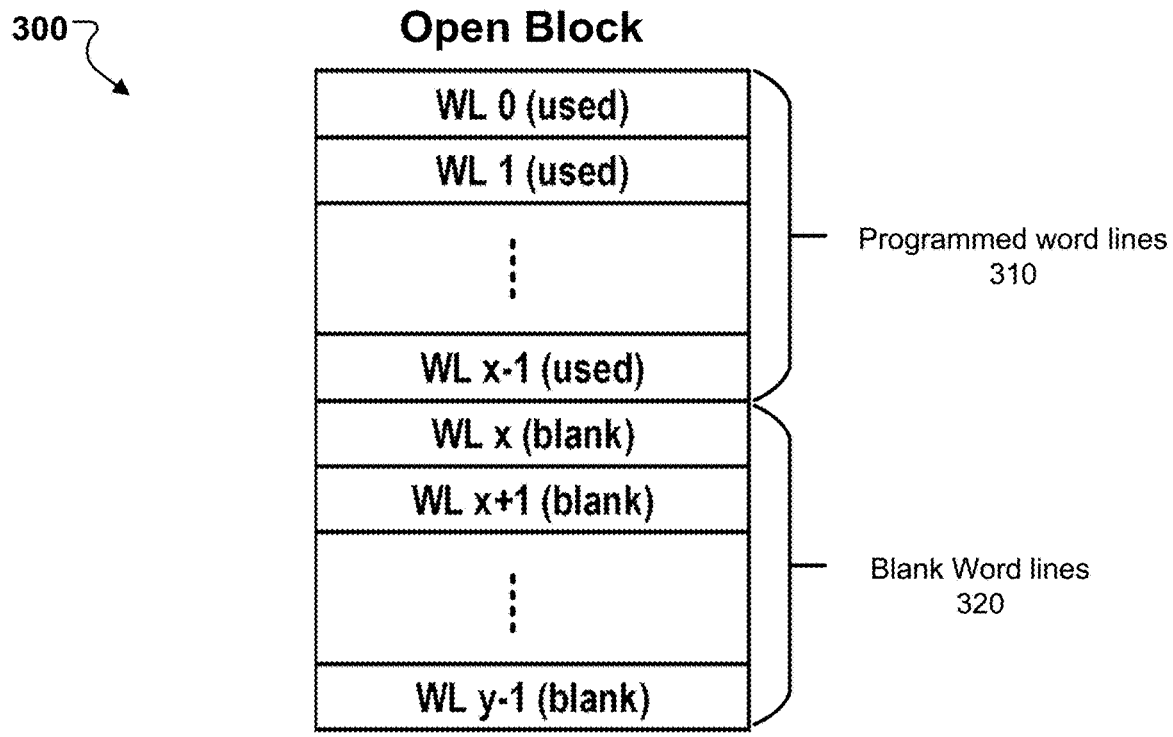
FIG. 3 illustrates an example of an open block in a memory, according to one or more implementations.

FIG. 3 illustrates an example of an open block 300 in a memory, according to one or more implementations. The open block can be the block 118 of FIGS. 1B and 1C. The memory can be the memory 116 of FIGS. 1A and 1B. The open block includes at least one programmed word line and at least one blank word line.

As illustrated in FIG. 3, the open block 300 includes y word lines, among which x word lines 310 have been used (or programmed) and (y-x) word lines 320 are blank (not used or not programmed). As discussed above, depending on the storing level (storing configuration or the data storing capability) of memory cells in a word line, the memory can partition one or more bits of each memory cell in the word line across one or more pages. For example, if the memory cell is an SLC the can store 1 bit, the memory cells in the word line can form one page; if the memory cell is an MLC that can store 2 bits, the memory cells in the word line can form two pages; if the memory cell is a TLC that can store 3 bits, the memory cells in the word line can form three pages; if the memory cell is a QLC that can store 4 bits, the memory cells in the word line can form four pages; if the memory cell is a PLC that can store 5 bits, the memory cells in the word line can form five pages.

Figure 4:
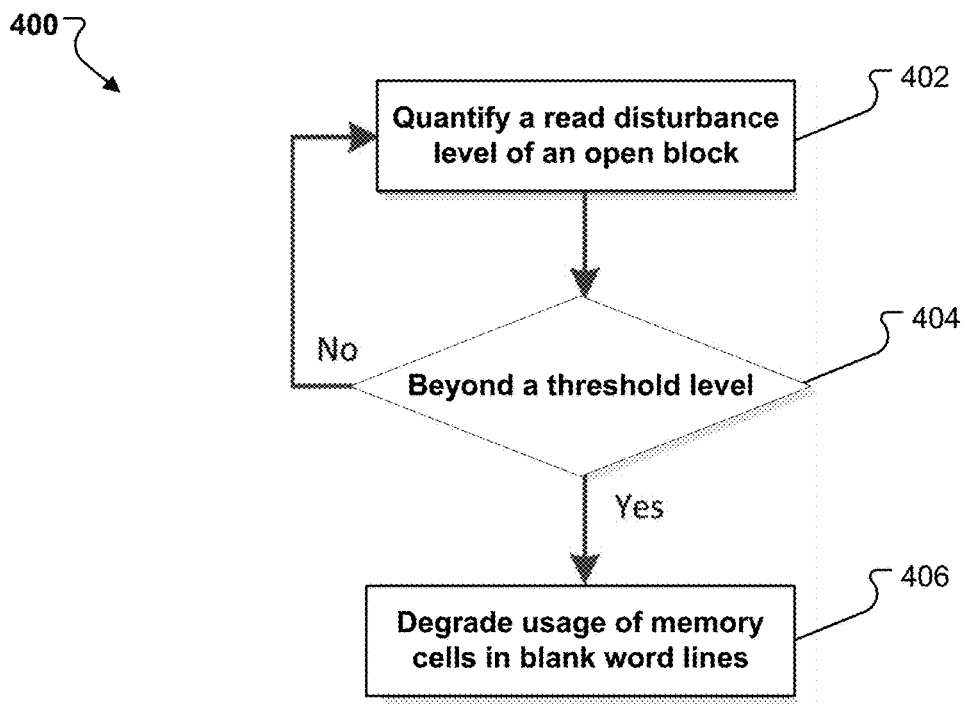
FIG. 4 illustrates an example of a process for managing open blocks in a memory, according to one or more implementations.

FIG. 4 illustrates an example of a process 400 for managing an open block in a memory, according to one or more implementations. The memory can be the memory 116 of FIGS. 1A-1B. The open block can be the block 118 of FIGS. 1B-1C, or the open block 300 of FIG. 3. The open block includes one or more programmed pages associated with one or more programmed lines and one or more blank pages associated with one or more blank word lines. The process 400 can be performed by a memory controller, e.g., the device controller 112 of FIG. 1A.

The memory controller quantifies a read disturbance level of the open block (402), e.g., as discussed with further details below in FIGS. 5, 6, 7A and 7B-1 to 7B-4. The memory controller can quantify or evaluate the read disturbance level in the open block in a series of scenarios, e.g., in response to an external request or command (such as a host request or command from a host device), automatically based on predetermined conditions, periodically, or during background operation. In some examples, the memory controller can quantify the read disturbance level after performing a predetermined number of write operations, a predetermined number of read operations, a predetermined number of erase operations, or any combination thereof. In some examples, the memory controller can quantify the read disturbance level after a predetermined number of pages have been programmed.

The memory controller determines whether the read disturbance level is beyond a threshold level (404). If the memory controller determines that the read disturbance level is not beyond the threshold level, the process 400 goes back to step 402 and the memory controller continues to quantify the read disturbance level of the open block. If the memory controller 400 determines that the read disturbance level is beyond the threshold level, the memory controller degrades usage of memory cells in at least one of the blank word lines (406), as discussed with further details in FIGS. 8A-8C, 9A-9B, and 10A-10B.

In some cases, if each memory cell in the open block can store more than 2 bits, e.g., TLC can store 3 bits, at step 406, the memory controller can first degrade the memory cells in at least one of the blank word line to memory cells having a lower storing level, e.g., MLC. Then, the process 400 can go back to step 402, and the memory controller can keep monitoring the read disturbance level of the open block when the at least one of the blank word lines is programmed. If the memory controller determines that a current read disturbance level is beyond the previous threshold level or a new threshold level higher than the previous threshold level, the memory controller can degrade the memory cells in at least one remaining blank word line to memory cells having an even lower storing level, e.g., SLC.

FIG. 5 illustrates an example 500 of quantifying a read disturbance level of an open block, according to one or more implementations. A memory controller, e.g., the device controller 112 of FIG. 1A, can quantify a read disturbance level of the open block in the memory by detecting a read disturbance of an erased state of memory cells in a blank word line of the open block. The memory can be the memory 116 of FIGS. 1A-1B. The open block can be the open block 118 of FIGS. 1B-1C or the open block 300 of FIG. 3. The blank word line can be the blank word line 320 of FIG. 3. The memory cells can be the memory cells 122 of FIG. 1C. For illustration purposes only, an MLC is illustrated as the memory cell.

As discussed above in FIG. 2, an MLC can represent four states including an erased state ER (1, 1) and three programmed states A (0, 1), B (0, 0), C (1, 0). A threshold voltage $V_{TH}$ of each state is within a respective threshold voltage range between a lower limit voltage Vl and a higher limit voltage Vh. For example, the erased state ER has a threshold voltage between Vl0 and Vh0; the first programmed state A has a threshold voltage between Vl1 and Vh1; the second programmed state B has a threshold voltage between Vl2 and Vh2; and the third programmed state C has a threshold voltage between Vl3 and Vh3. Curves 502, 504, 506, 508 show threshold voltage distributions of the respective states ER, A, B, C of the memory cell, respectively.

In the blank word line, memory cells are in the erased state ER, as illustrated by a solid line in FIG. 5. Due to operations on memory cells in programmed word lines of the open block, the memory cells in the blank word line may experience read disturbance. The threshold voltage distribution of the erased state ER may change from curve 502 to curve 502'. The memory controller can quantify the read disturbance level of the open block by detecting a higher limit voltage of the erased state of the memory cells in the blank word line. For example, the memory controller can increase a read voltage $V_A$ from the original higher limit voltage Vh0. In particular, the memory controller can test the memory cell under a sequence of progressively higher read voltages. If the memory cell is turned off under a current read voltage $V_A$, it indicates that the current read voltage $V_A$ is still lower than the new higher limit voltage Vh0' of the erased state, and the memory controller can progressively increase the read voltage $V_A$. When the memory cell is first turned on under a current read voltage $V_A$, it indicates that the current read voltage $V_A$ is identical to or higher than the new higher limit voltage Vh0', and the current read voltage $V_A$ can be considered as the new higher limit voltage Vh0' of the erased state ER. As illustrated in FIG. 5, the erased state ER has the new higher limit voltage Vh0', which is in the threshold voltage range of the first programmed state A. That is, the erased state ER overlaps with the first programmed state A.

In some implementations, if the higher limit voltage of the erased state in the blank word line is in the threshold voltage range of at least one programmed state, the memory controller can determine that the read disturbance level is beyond a threshold level. In some cases, the erased state ER overlaps a majority or all the programmed states, e.g., A and B, or A, B, and C. The memory controller may determine that the read disturbance level is beyond a second threshold level and the open block can be no longer used. If the memory controller determines that the read disturbance level is between the threshold level and the second threshold level, the memory controller can degrade usage of memory cells in the blank word line in the open block, e.g., as described in step 406 of FIG. 4.

In some examples, the memory controller determines a number of memory cells having overlapping states in the blank word line. If the number of memory cells having overlapping states is beyond a threshold number, the memory controller can determine that the read disturbance level is beyond the threshold level. In some cases, if the number of memory cells having overlapping states is too large and beyond a second threshold number, the memory controller may determine that the read disturbance level is beyond the second threshold level and the open block can be no longer used. The memory controller may degrade usage of memory cells in the blank word line in the open block, e.g., as described in step 406 of FIG. 4, in response to determining that the read disturbance level is below the second threshold level and beyond the threshold level.

FIG. 6 illustrates another example 600 of quantifying a read disturbance level of an open block, according to one or more implementations. A memory controller, e.g., the device controller 112 of FIG. 1A, can quantify a read disturbance level of the open block in the memory by detecting a read disturbance of memory cells in a programmed word line of the open block. The memory can be the memory 116 of FIGS. 1A-1B. The open block can be the open block 118 of FIGS. 1B-1C or the open block 300 of FIG. 3. The blank word line can be the blank word line 320 of FIG. 3. The memory cells can be the memory cells 122 of FIG. 1C. For illustration purposes only, an MLC is illustrated as the memory cell.

As discussed above in FIGS. 2 and 5, an MLC can represent four states including an erased state ER (1, 1) and three programmed states A (0, 1), B (0, 0), C (1, 0). A threshold voltage $V_{TH}$ of each state of the memory cell is within a respective threshold voltage range between a lower limit voltage Vl and a higher limit voltage Vh. For example, the erased state ER has a threshold voltage between Vl0 and Vh0; the first programmed state A has a threshold voltage between Vl1 and Vh1; the second programmed state B has a threshold voltage between Vl2 and Vh2; and the third programmed state C has a threshold voltage between Vl3 and Vh3. Curves 602, 604, 606, 608 show threshold voltage distributions of the respective states ER, A, B, C of the memory cell, respectively.

Due to read operations on memory cells in programmed word lines of the open block, the memory cells in the programmed word line may experience read disturbance. As illustrated in FIG. 6, the threshold voltage distributions of the states ER, A, B, C with read disturbance may be represented by new curve 602', 604', 606', and 608'. The erased state ER has a new threshold voltage between Vl0' and Vh0'; the first programmed state A has a new threshold voltage between Vl1' and Vh1'; the second programmed state B has a new threshold voltage between Vl2' and Vh2'; and the third programmed state C has a new threshold voltage between Vl3' and Vh3'. As shown in FIG. 6, the erased state experiences a larger read disturbance effect and has a larger increased threshold voltage than the first programmed state A. The first programmed state A experiences a larger read disturbance effect and has an increased threshold voltage larger than the second programmed state B. The second programmed state B experiences a larger read disturbance effect and has an increased threshold voltage larger than the third programmed state C.

The least significant bits (LSBs) of all memory cells in a word line form an LSB page of the word line, and the most significant bits (MSBs) of these cells in the word line form an MSB page of the word line. The memory controller can determine whether a bit in the programmed page is an error bit by determining whether a memory cell storing the bit has overlapping states or whether the threshold voltage of a state of the memory cell representing the bit is higher than an original higher limit voltage of the state, as illustrated in FIGS. 2 and 5.

To check a bit in the LSB page, the memory controller can apply a read voltage VB between Vh1 and Vl2. If the memory cell is in a turned-on state, it means that the bit is "1"; if the memory cell is in a turn-off state, it means that the bit is "0", which may be an error bit. To check a bit in the MSB page, the memory controller can first apply a read voltage $V_A$. If the memory cell is in a turned-on state, it means that the bit is "1"; if the memory cell is in a turn-off state, it means that the bit is "0" or "1". Then the memory controller can apply another read voltage $V_C$. If the memory cell is in a turned-on state, it means that the bit is "0"; if the memory cell is in a turn-off state, it means that the bit is "1", which may be an error bit.

The bits in the MSB page experience a larger read disturbance effect than the bits in the LSB page. The memory controller can quantify the read disturbance level of the open block by checking the number of error bits in the MSB page of a programmed word line in the open block. If the number of error bits in the MSB page is beyond a threshold number, the memory controller can determine that the read disturbance level of the open block is beyond a threshold level. The threshold number can be predetermined based on a number of correction bits in error correction codes (ECCs) for the programmed page. The number of correction bits of each ECC is configured to correct a chunk of a page. For example, if the number of correction bits in ECCs is 30 per chunk, the threshold number for the chunk can be smaller than 30, e.g., 15 or 20. In this way, the memory controller can manage the open block before data corruption. In some cases, if the number of error bits is too large and beyond a second threshold number, e.g., 25 or 27, the memory controller may determine that the read disturbance level is beyond a second threshold level and the open block can be no longer used. The memory controller may degrade usage of memory cells in the blank word line in the open block, e.g., as described in step 406 of FIG. 4, in response to determining that the read disturbance level is below the second threshold level and beyond the threshold level.

Figure 7A:
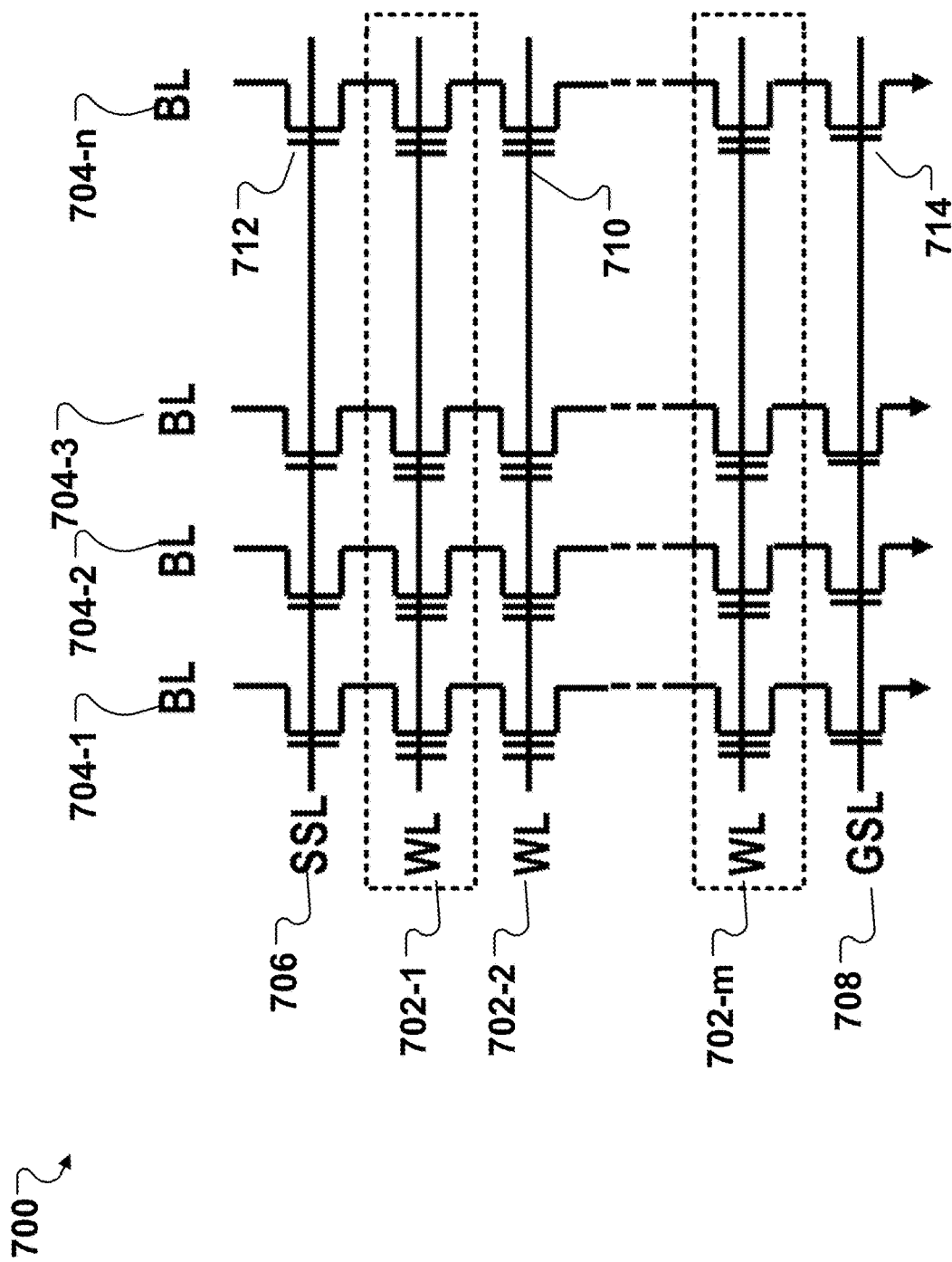
FIG. 7A illustrates an example of weak word lines in a block, according to one or more implementations.
Figures 1, 2, 3, 4, 7B:

FIGS. 7A-7B illustrate another example of quantifying a read disturbance level of an open block 700 in a memory, according to one or more implementations. A memory controller, e.g., the device controller 112 of FIG. 1A, can quantify a read disturbance level of the open block in the memory by detecting a read disturbance of memory cells in a weak blank word line of the open block. The memory can be the memory 116 of FIGS. 1A-1B. The open block can be the open block 118 of FIGS. 1B-1C or the open block 300 of FIG. 3. The blank word line can be the blank word line 320 of FIG. 3. The memory cells can be the memory cells 122 of FIG. 1C.

FIG. 7A illustrates an example of weak word lines in the open block 700. The open block 700 includes a number of memory cells 710 connected in series into rows by word lines 702-1, 702-2, . . . , 702-m and into columns by bit lines 704-1, 704-2, 704-3, . . . , 704-n. Each bit line also connects the memory cells 710 to a source select transistor (SST) 712 and a ground select transistor (GST) 714. Gates of the SSTs 712 in different bit lines are also connected to a source select line (SSL) 706. Gates of the GSTs 714 in different strings are also connected to a ground select line (GSL) 708.

In a block, each read operation on a word line has different read disturbance effects on all other word lines because they resist different stresses. The block may include one or more weak word lines. A weak word line is more sensitive to be disturbed by operations on other word lines in the same block. As illustrated in FIG. 7A, the word lines 702-1 and 702-m may be weak word lines in the open block 700. The word lines 702-1 and 702-m are first and last word lines that may be affected by transistors in the SSL 706 and GSL 708, which makes them weaker than other word lines in the open block 700.

In some implementations, the memory controller can program a specific pattern, e.g., after disabling a randomizer, in a page associated with the weak word line, e.g., as illustrated in FIGS. 7B-1 to 7B-4. Then the memory controller can quantify a read disturbance level of the open block 700 by evaluating a read disturbance effect on the programmed page, e.g., by detecting overlapping states in memory cells in the programmed word line as illustrated in FIG. 5 and/or by detecting a number of error bits in the programmed page as illustrated in FIG. 6.

FIGS. 7B-1 to 7B-4 illustrate examples of programming a specific pattern in bits of the page associated with a weak word line, according to one or more implementations. As shown in FIG. 7B-1, each bit in the page is programmed into "1". As shown in FIG. 7B-2, the memory controller is configured to program the first bit and the last bit of the page to be "1" and program data in remaining bits of the page. As shown in FIG. 7B-3, the memory controller is configured to program the first and end bits of every chunk of the page into "1" and program data in remaining bits in the chunk. As shown in FIG. 7B-4, the page includes series of sequential bits, each of the bits having a respective unique number. The memory controller is configured to alternate between programming "1" and programming data in the bit in the sequence. For example, odd bits can be programmed as "1" and even bits can be programmed with data.

Implements of the present disclosure also provide methods of managing (adjusting or degrading) memory cells in a blank word line, e.g., to avoid read disturbance effects and to use unusable blank pages due to the read disturbance effects. In the following, FIGS. 8A-8C, 9A-9B, and 10A-10B illustrate three exemplary approaches.

Figure 8A:
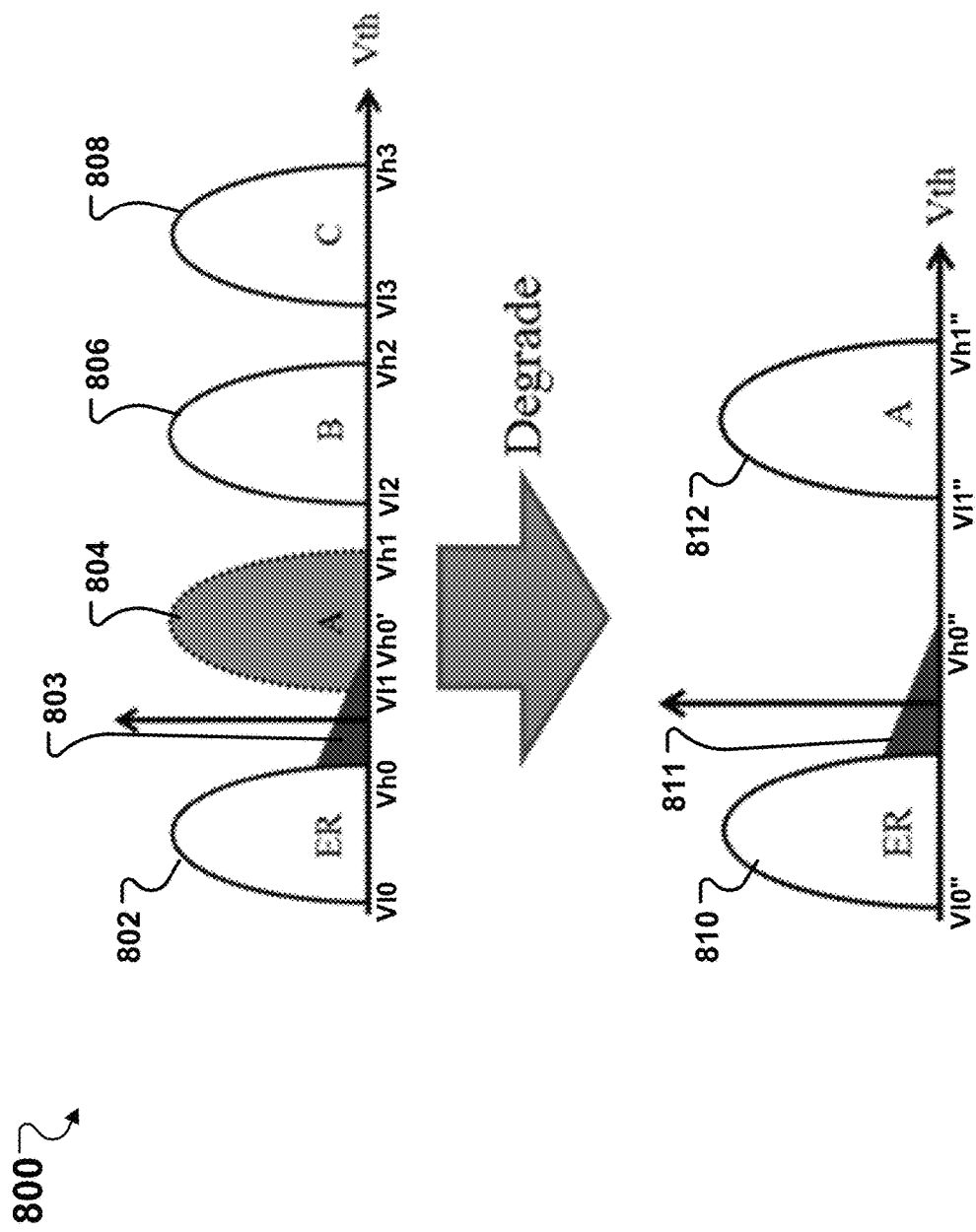
FIG. 8A illustrates an example of degrading a storing level of memory cell from MLC to SLC to avoid overlapping states, according to one or more implementations.

FIGS. 8A-8C illustrate examples of degrading a storing level (or storing configuration) of a memory cell in a blank word line in an open block of a memory, according to one or more implementations. A memory controller, e.g., the device controller 112 of FIG. 1A, can perform the degrading. The memory can be the memory 116 of FIGS. 1A-1B. The open block can be the open block 118 of FIGS. 1B-1C or the open block 300 of FIG. 3. The blank word line can be the blank word line 320 of FIG. 3. The memory cells can be the memory cells 122 of FIG. 1C.

As shown in FIG. 8A, an MLC is illustrated as an example. As discussed above in FIGS. 2 and 5, an MLC can represent four states including an erased state ER and three programmed states A, B, C. A threshold voltage VTH of each state is within a respective threshold voltage range between a lower limit voltage Vl and a higher limit voltage Vh. For example, the erased state ER has a threshold voltage between Vl0 and Vh0; the first programmed state A has a threshold voltage between Vl1 and Vh1; the second programmed state B has a threshold voltage between Vl2 and Vh2; and the third programmed state C has a threshold voltage between Vl3 and Vh3. Curves 602, 604, 606, 608 show threshold voltage distributions of the respective states ER, A, B, C of the memory cell, respectively.

In the blank word line, memory cells are in the erased state ER. Due to read operations on memory cells in programmed word lines of the open block, the memory cells in the blank word line may experience read disturbance. The threshold voltage distribution of the erased state ER may extend into the threshold voltage range of the programmed state A, as illustrated by an extension part 803 in FIG. 8A. The higher limit voltage of the erased state ER becomes Vh0', which is in the range of Vl1 and Vh1. That is, the erased state ER overlaps with the programmed state A. The erased state ER and the programmed state A are disturbed states, and the programmed states B and C are undisturbed states.

To reuse the memory cells in the blank word line, the memory controller can degrade the storing level of the memory cell from MLC to SLC. The memory cell can store only 1 bit, instead of 2 bits. Accordingly, the number of states representable by the memory cell is reduced from 4 states (ER, A, B, C) to 2 states (ER and A). The memory controller can redefine threshold voltage ranges for the new ER and A states such that the new erased state ER and the new programmed state A does not overlap. The memory controller can redefine the threshold voltage ranges of the new ER and A states within a voltage range from Vl0 to Vh3.

As illustrated in FIG. 8A, the memory controller can redefine the threshold voltage range from a new lower limit voltage Vl0" to a new higher limit voltage Vh0", and its threshold voltage distribution is shown by curve 810 and an extension portion 811. The new lower limit voltage Vl0' can be no lower than the original lower limit voltage Vl0. The new higher limit voltage Vh0" is higher than the original higher limit voltage Vh0 and no less than Vh0'. The memory controller can redefine the threshold voltage range of the new programmed state A to be a new lower limit voltage Vl1" and a new higher limit voltage Vh1", and its threshold voltage distribution is shown by curve 812. The new lower limit voltage Vl1" of the programmed state A is higher than the new higher limit voltage Vh0" of the new erased state ER and higher than the original lower limit voltage Vl1 of the original programmed state A. The new higher limit voltage Vh1" can be in a range from Vl2 to Vh3. A width of the new threshold voltage range of the new programmed state A can be larger than the threshold voltage range of the original programmed state A.

FIG. 8B illustrates another example 830 of degrading a storing level of memory cell from TLC to MLC in a blank word line in an open block to avoid overlapping states. The TLC can have 8 states 832 including an erased state ER and seven programmed states A, B, C, D, E, F, G in series. Due to read disturbance, the threshold voltage of the erased state ER extends into the threshold voltage range of the first programmed state A and the second programmed state B. That is, the states A and B are disturbed states, and the states C, D, E, F, G are undisturbed states. The memory controller can degrade the memory cell from TLC to MLC for storing 2 bits that can represent 4 new states 834 including the new erased state ER and the new programmed states A, B, C. The memory controller can redefine the threshold voltage ranges for the new states within a voltage range from a lower limit range of the original erased state ER to a higher limit voltage of the original programmed state G.

FIG. 8C illustrates a further example 850 of degrading a storing level of memory cell from TLC to SLC to avoid overlapping states. The TLC can have 8 states 852 including an erased state ER and seven programmed states A, B, C, D, E, F, G in series. Due to read disturbance, the threshold voltage of the erased state ER extends into the threshold voltage range of the first programmed state A and the second programmed state B. That is, the states A and B are disturbed states, and the states C, D, E, F, G are undisturbed states. The memory controller can degrade the memory cell from TLC to SLC for storing 1 bit that can represent 2 new states 854 including the new erased state ER and the new programmed state A. The memory controller can redefine the threshold voltage ranges for the new states within a voltage range from a lower limit range of the original erased state ER to a higher limit voltage of the original programmed state G.

Figure 9A:
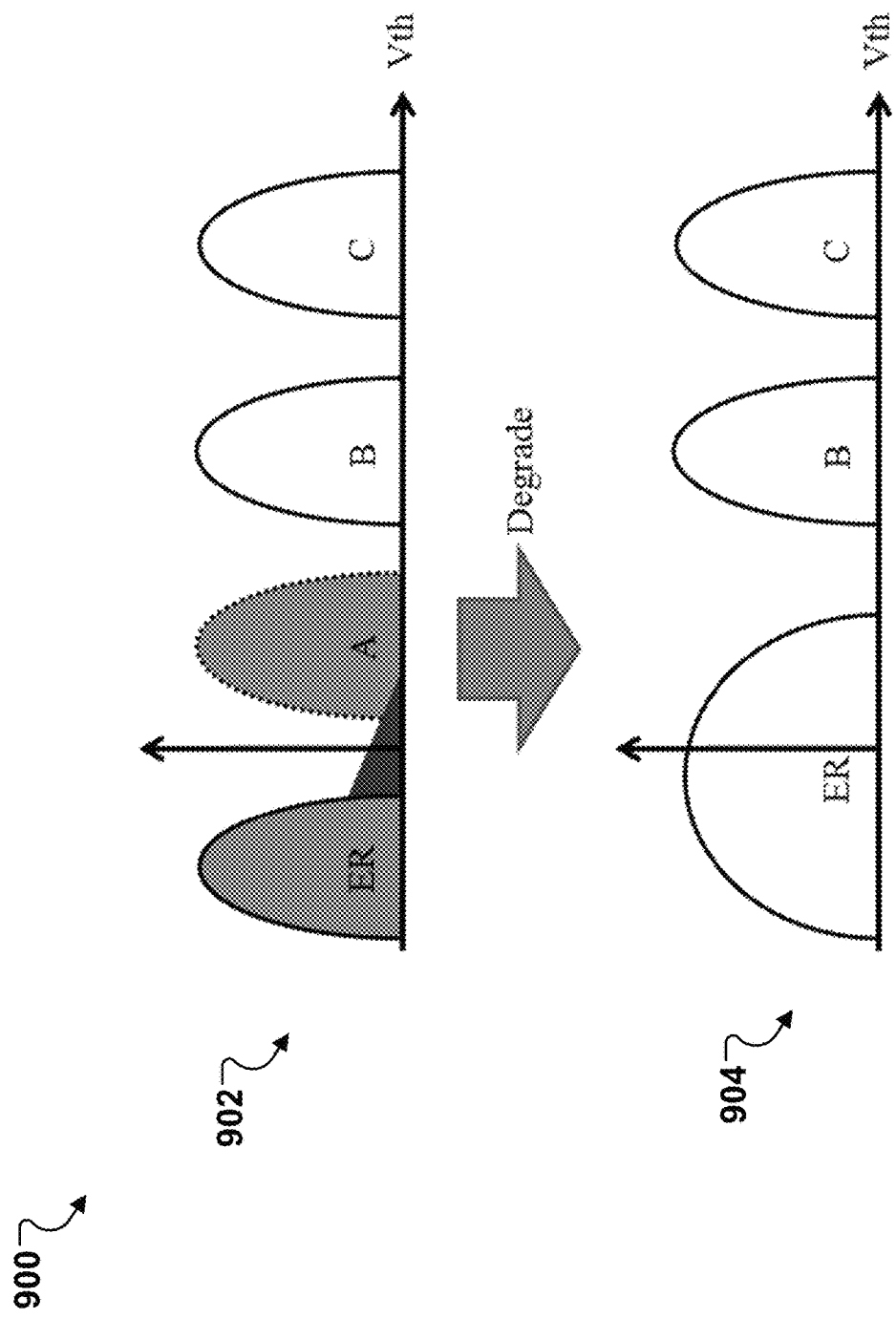
FIG. 9A illustrates an example of degrading states of a memory cell to avoid overlapping states, according to one or more implementations.
Figure 9B:
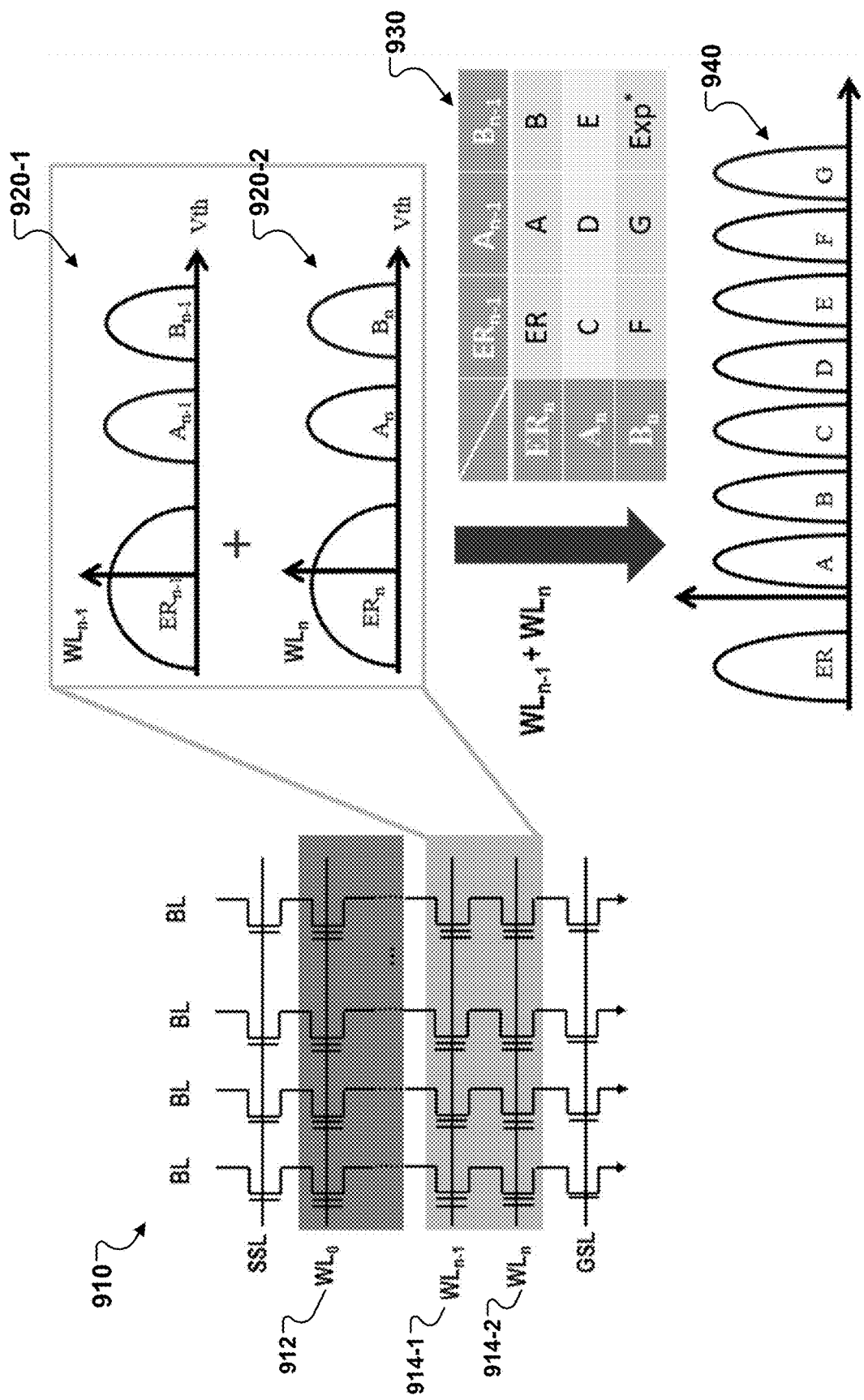
FIG. 9B illustrates an example of combining memory cells with degraded states in adjacent word lines to represent new states, according to one or more implementations.

FIGS. 9A-9B illustrate another example of degrading usage of memory cells in blank word lines in an open block of a memory 910, according to one or more implementations. A memory controller, e.g., the device controller 112 of FIG. 1A, can perform the degrading. The memory can be the memory 116 of FIGS. 1A-1B. The open block 910 can be the open block 118 of FIGS. 1B-1C or the open block 300 of FIG. 3. As illustrated in FIG. 9B, the open block 910 includes n word lines that have at least one programmed line WL0 912 and at least two blank word lines WLn−1 914-1, WLn 914-2. The blank word lines 914-1, 914-2 can be the blank word lines 320 of FIG. 3. The memory cells can be the memory cells 122 of FIG. 1C. For illustration purposes only, MLC is illustrated as an example of the memory cell. As discussed above in FIGS. 2 and 5, an MLC can represent four states including an erased state ER and three programmed states A, B, C.

FIG. 9A illustrates an example 900 of degrading states of the MLC to avoid overlapping states. For the original four states 902, due to read disturbance, the erased state ER may overlap with the programmed state A. That is, the programmed state A is disturbed. The other two programmed states B and C are undisturbed. The memory controller can degrade the memory cell from representing four states ER, A, B, C, as illustrated by 902 in FIG. 9A, to representing three new states ER, B, and C, as illustrated by 904 in FIG. 9A. In some cases, the memory controller can redefine the threshold voltage ranges for the new three states ER, B, C. In some cases, as the original states B and C are undisturbed, the memory controller can redefine the new erased state A based on the disturbed original states ER and A, e.g., by redefining the threshold voltage range of the new erased state A within the range from the lower limit voltage of the original erased state ER to the higher limit voltage of the original programmed state A.

Referring to FIG. 9B, memory cells in the two adjacent blank word lines WLn−1 and WLn can be degraded, same as what is illustrated in FIG. 9A, from representing 4 states to representing 3 states. Diagram 920-1 shows the three states of the memory cells in the blank word line WLn−1, that is, ERn−1, An−1 and Bn−1; and diagram 920-2 shows the three states of the memory cells in the blank word line WLn, that is, ERn, An and Bn. Then, the memory controller can combine memory cells in the two adjacent blank word lines WLn−1 and Wn to represent nine new states, ER, A, B, C, D, E, F, G, and Exp*, as illustrated in table 930. For example, states ERn−1 and ERn can be used together to represent new erased state ER, states An−1 and Bn can be used to represent new programmed state G. As 3 bits correspond to 8 states, the highest programmed state Exp* based on states Bn−1 and Bn is not used. Thus, two degraded memory cells in two adjacent two adjacent blank word lines WLn−1 and WLn can store 3 bits, smaller than 4 bits for two original MLCs.

Figure 10A:
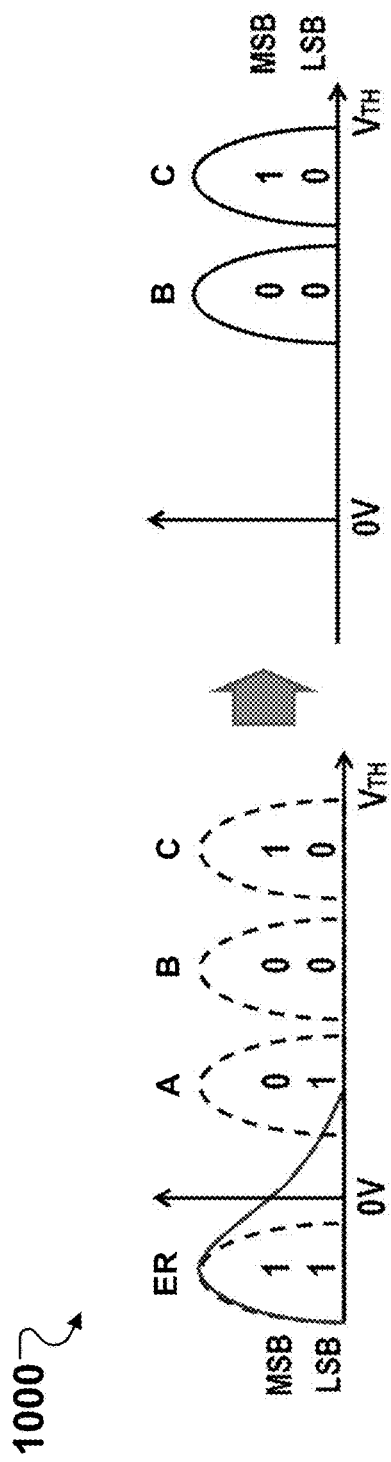
FIG. 10A illustrates an example of programming a fix pattern in a lower page to avoid overlapping states in memory cells, according to one or more implementations.
Figure 10B:
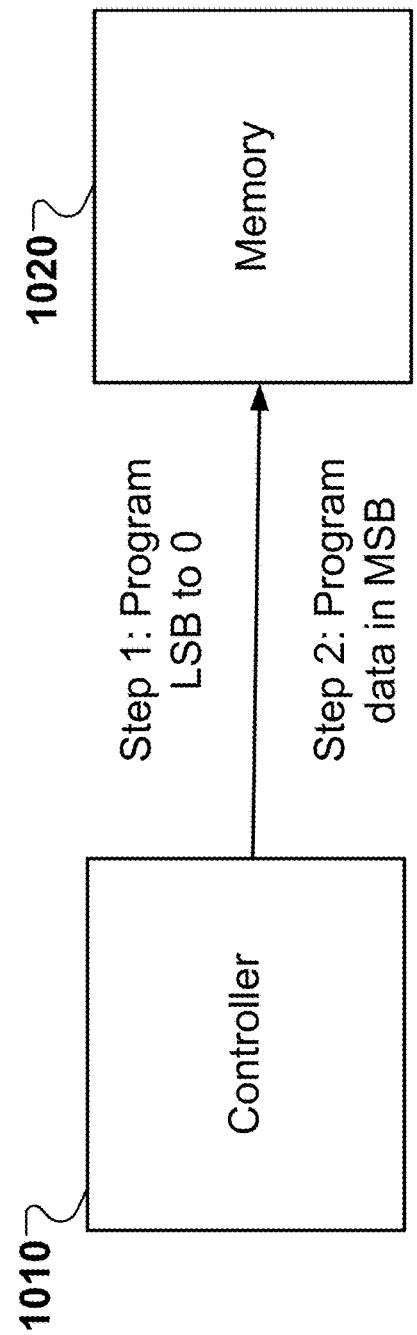
FIG. 10B illustrates an example of process steps of FIG. 10A, according to one or more implementations.

FIGS. 10A-10B illustrate another example of degrading usage of memory cells in blank word lines in an open block of a memory 1020 by a memory controller 1010, according to one or more implementations. The memory 1020 can be the memory 116 of FIGS. 1A-1B. The open block can be the open block 118 of FIGS. 1B-1C or the open block 300 of FIG. 3. The blank word lines can be the blank word lines 320 of FIG. 3. The memory cells can be the memory cells 122 of FIG. 1C. For illustration purposes only, MLC is illustrated as an example of the memory cell.

As discussed above in FIGS. 2 and 5, an MLC can represent four states including an erased state ER (1, 1) and three programmed states A (0, 1), B (0, 0), C (1, 0). The memory 1020 can partition the two bits of each memory cell in a word line across two pages. The least significant bits (LSBs) of all memory cells in a word line form an LSB page of the word line, and the most significant bits (MSBs) of these cells on the word line form an MSB page of the word line.

As shown in FIG. 10A, due to read disturbance, the erased state ER of a memory cell can overlap with the programmed state A. That is, the erased state ER and the programmed state A are disturbed, and the other programmed states B and C are undisturbed. The memory controller 1010 can just use the undisturbed programmed states B and C of the memory cells for storing data. As the bits in the LSB page are both "0" for the undisturbed programmed states B and C, data can be stored by bits in the MSB page that are "0" and "1" for the undisturbed programmed states B and C. As shown in FIG. 10B, the memory controller 1010 can first program bits in the LSB page to be "0" and then program data in bits of the MSB page. In this way, the memory controller can degrade usage of the memory cells in the blank word lines in the open block of the memory 1020 by changing programming steps in the controller itself, without changing the memory 1020, e.g., without redefining threshold voltage ranges for states of the memory cells in the memory 1020.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory system comprising:
    a memory comprising multiple blocks each having a plurality of pages associated with a plurality of word lines; and
    a memory controller coupled to the memory and configured to:
        evaluate a read disturbance level of an open block, the open block comprising one or more programmed pages associated with one or more programmed word lines and one or more blank pages associated with one or more blank word lines; and
        in response to determining that the read disturbance level of the open block is beyond a threshold level, manage memory cells in at least one of the one or more blank word lines in the open block such that each memory cell in the at least one of the one or more blank word lines in the open block has a smaller data storing capacity than each memory cell in at least one of the one or more programmed word lines in the open block.

2. The memory system of claim 1, wherein each memory cell in the at least one of the one or more programmed word lines has a first storing level for storing a first number of bits, and
wherein the memory controller is configured to:
degrade each memory cell in the at least one of the one or more blank word lines to have a second storing level for storing a second number of bits, the second number being smaller than the first number.

3. The memory system of claim 2, wherein the first number of bits represents a first number of states, and the second number of bits represents a second number of states, the second number of states being smaller than the first number of states, and
wherein the memory controller is configured to degrade the memory cells in the at least one of the one or more blank word lines by configuring threshold voltage ranges of the memory cells in the at least one of the one or more blank word lines to represent the second number of states.

4. The memory system of claim 1, wherein each memory cell in the at least one of the one or more programmed word lines is capable of representing a first number of states, and
wherein the memory controller is configured to degrade each memory cell in the at least one of the one or more blank word lines to be capable of representing a second number of states, the second number being smaller than the first number.

5. The memory system of claim 4, wherein the memory controller is configured to:
degrade each memory cell in at least two adjacent blank word lines of the one or more blank word lines to be capable of representing the second number of states; and
combine at least two memory cells in the at least two adjacent word lines to represent a third number of states, each of the at least two memory cells being in a respective one of the at least two adjacent word lines, the third number of states being a combination of the second number of states of each of the at least two memory cells.

6. The memory system of claim 1, wherein each memory cell in the at least one of the one or more programmed word lines is capable of representing a series of states,
wherein the memory controller is configured to:
store data into memory cells in the at least one of the one or more blank word lines by representing the data by the memory cells in at least two selected states among the series of states, each of the at least two selected states having a threshold voltage higher than other unselected states among the series of states.

7. The memory system of claim 6, wherein the memory cells in the at least one of the one or more blank word lines are programmable into a lower page and at least one higher page and
wherein the memory controller is configured to:
program bits in the lower page to be a fixed pattern; and
program bits in the at least one higher page to represent the data.

8. The memory system of claim 1, wherein each memory cell in the at least one of the one or more programmed word lines is capable of representing a plurality of states including an erased state and a series of programmed states, each of the plurality of states having a respective threshold voltage range, and
wherein the memory controller is configured to determine that a memory cell in the open block has overlapping states at least by determining that the erased state of the memory cell has a higher limit voltage in a corresponding threshold voltage range of at least one of the series of programmed states.

9. The memory controller of claim 8, wherein the memory controller is configured to determine that the read disturbance level of the open block is beyond the threshold level by determining that a number of memory cells having overlapping states in one of the one or more blank word lines exceeds a threshold number.

10. The memory system of claim 1, wherein the memory controller is configured to determine that the read disturbance level of the open block is beyond the threshold level by determining that a number of error bits in one of the one or more programmed pages exceeds a threshold number.

11. The memory system of claim 10, wherein the threshold number is predetermined based on a number of correction bits in error correction codes (ECCs) for the one of the one or more programmed pages.

12. The memory system of claim 10, wherein the one of the one or more programmed pages is associated with a specific word line in the open block, memory cells in the specific word line being more sensitive to be disturbed than memory cells in other word lines in the open block.

13. The memory system of claim 12, wherein each bit in the one of the one or more programmed pages is programmed to be a fixed value.

14. The memory system of claim 12, wherein the one of the one or more programmed pages comprises a series of sequential bits, and
wherein the memory controller is configured to program at least one bit in at least one of a starting region or an ending region of the series of sequential bits to be a fixed value.

15. The memory system of claim 12, wherein the one of the one or more programmed pages comprises multiple chunks each having a series of sequential bits, and
wherein the memory controller is configured to program at least one bit in at least one of a starting region or an ending region of the series of sequential bits in each of the chunks to be a fixed value.

16. The memory system of claim 12, wherein the one of the one or more programmed pages comprises a series of sequential bits, and
wherein the memory controller is configured to program alternating bits in the series with data and a fixed value.

17. The memory system of claim 1, wherein the memory controller is configured to evaluate the read disturbance level based on at least one of characteristics of the open block, the characteristics of the open block comprising an erase count and a read count.

18. The memory system of claim 1, wherein the memory controller is configured to store user data or redundancy in memory cells in the at least one of the one or more blank word lines.

19. A memory controller comprising:
at least one processor; and
at least one non-transitory machine-readable storage medium coupled to the at least one processor having machine-executable instructions stored thereon that, when executed by the at least one processor, cause the at least one processor to perform operations comprising:
evaluate a read disturbance level of an open block in a memory, the open block comprising one or more programmed pages associated with one or more programmed word lines and one or more blank pages associated with one or more blank word lines; and
in response to determining that the read disturbance level of the open block is beyond a threshold level, manage memory cells in at least one of the one or more blank word lines in the open block such that each memory cell in the at least one of the one or more blank word lines in the open block has a smaller data storing capacity than each memory cell in at least one of the one or more programmed word lines in the open block.

20. A memory system comprising:
a memory comprising multiple blocks each having a plurality of pages associated with a plurality of word lines; and
a memory controller coupled to the memory and configured to:
manage memory cells in one or more blank word lines in an open block such that each memory cell in at least one of the one or more blank word lines in the open block has a smaller data storing capacity than each memory cell in at least one of one or more programmed word lines in the open block, then
store data in the memory cells in the at least one of the one or more blank word line in the open block.

* * * * *